(12) United States Patent
Kellerman et al.

(10) Patent No.: US 9,677,193 B2
(45) Date of Patent: Jun. 13, 2017

(54) SHEET PRODUCTION APPARATUS FOR REMOVING A CRYSTALLINE SHEET FROM THE SURFACE OF A MELT USING GAS JETS LOCATED ABOVE AND BELOW THE CRYSTALLINE SHEET

(71) Applicant: Varian Semiconductor Equipment Associates, Inc., Gloucester, MA (US)

(72) Inventors: Peter L. Kellerman, Essex, MA (US); Gregory D. Thronson, Groveland, MA (US); Dawei Sun, Nashua, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 365 days.

(21) Appl. No.: 14/242,566

(22) Filed: Apr. 1, 2014

(65) Prior Publication Data

US 2014/0209016 A1    Jul. 31, 2014

Related U.S. Application Data

(62) Division of application No. 13/037,789, filed on Mar. 1, 2011, now Pat. No. 8,685,162.

(Continued)

(51) Int. Cl.
*C30B 15/22*    (2006.01)
*C30B 35/00*    (2006.01)
(Continued)

(52) U.S. Cl.
CPC ............... *C30B 35/00* (2013.01); *C30B 9/00* (2013.01); *C30B 11/00* (2013.01); *C30B 15/06* (2013.01); *C30B 15/22* (2013.01); *C30B 28/10* (2013.01); *C30B 29/06* (2013.01); *C30B 29/52* (2013.01); *C30B 29/64* (2013.01); *C30B 15/00* (2013.01);
(Continued)

(58) Field of Classification Search
CPC ....... C30B 35/00; C30B 35/005; C30B 15/00; C30B 15/06; C30B 15/20; C30B 15/22; C30B 15/32; C30B 29/00; C30B 29/02; C30B 29/06; Y10T 117/00; Y10T 117/10; Y10T 117/1004; Y10T 117/1008; Y10T 117/1016; Y10T 117/1024; Y10T 117/1032; Y10T 117/1036;
(Continued)

(56) References Cited

U.S. PATENT DOCUMENTS 4,221,754 A * 9/1980 Nowak ............... C30B 15/00
117/20
4,329,195 A * 5/1982 Kudo ............... C30B 15/002
117/27
(Continued)

FOREIGN PATENT DOCUMENTS

JP    2001122696 A    5/2001
WO    2009/114764 A1    1/2009

*Primary Examiner* — Kenneth A Bratland, Jr.

(57) ABSTRACT

In one embodiment, a sheet production apparatus comprises a vessel configured to hold a melt of a material. A cooling plate is disposed proximate the melt and is configured to form a sheet of the material on the melt. A first gas jet is configured to direct a gas toward an edge of the vessel. A sheet of a material is translated horizontally on a surface of the melt and the sheet is removed from the melt. The first gas jet may be directed at the meniscus and may stabilize this meniscus or increase local pressure within the meniscus.

5 Claims, 10 Drawing Sheets

Related U.S. Application Data

(60) Provisional application No. 61/332,073, filed on May 6, 2010.

(51) Int. Cl.
*C30B 15/06* (2006.01)
*C30B 28/10* (2006.01)
*C30B 29/06* (2006.01)
*C30B 29/52* (2006.01)
*C30B 29/64* (2006.01)
*C30B 9/00* (2006.01)
*C30B 11/00* (2006.01)
*C30B 15/00* (2006.01)
*C30B 15/24* (2006.01)
*C30B 15/34* (2006.01)

(52) U.S. Cl.
CPC ............ *C30B 15/002* (2013.01); *C30B 15/24* (2013.01); *C30B 15/34* (2013.01); *Y10T 117/1048* (2015.01); *Y10T 117/1092* (2015.01)

(58) Field of Classification Search
CPC ......... Y10T 117/1044; Y10T 117/1048; Y10T 117/1068; Y10T 117/1072
USPC .......... 117/11, 13–16, 23, 26–27, 30, 33–34, 117/200–202, 204, 206, 208–209, 117/211–212, 217–218, 914, 922, 928, 117/931–932
See application file for complete search history.

(56) References Cited

U.S. PATENT DOCUMENTS 4,627,887 A * 12/1986 Sachs .................... C30B 15/002
117/24
6,019,576 A * 2/2000 Thut ....................... F04D 7/065
415/200

* cited by examiner

SHEET PRODUCTION APPARATUS FOR REMOVING A CRYSTALLINE SHEET FROM THE SURFACE OF A MELT USING GAS JETS LOCATED ABOVE AND BELOW THE CRYSTALLINE SHEET

CROSS-REFERENCE TO RELATED APPLICATIONS

This application claims priority to the U.S. Patent Application entitled "Removing a Sheet from the Surface of a Melt Using Gas Jets," filed Mar. 1, 2011 and assigned U.S. application Ser. No. 13/037,789 and provisional patent application entitled "Removing a Horizontal Crystal Sheet from the Surface of a Melt Using Gas Jets," filed May 6, 2010 and assigned U.S. App. No. 61/332,073, the disclosure of which is hereby incorporated by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

FIELD

This invention relates to sheet formation from a melt and, more particularly, to removing the sheet from the melt.

BACKGROUND

Silicon wafers or sheets may be used in, for example, the integrated circuit or solar cell industry. Demand for solar cells continues to increase as the demand for renewable energy sources increases. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases, one goal of the solar cell industry is to lower the cost/power ratio. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 μm thick. To maintain single crystal growth, the boule must be grown slowly, such as less than 10 μm/s, from a crucible containing a melt. The subsequent sawing process leads to approximately 200 μm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries and this lower quality results in lower efficiency solar cells. The sawing process for a polycrystalline silicon ingot is as inefficient as a monocrystalline silicon ingot or boule.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 μm.

Producing sheets horizontally from a melt may be less expensive than silicon sliced from an ingot and may eliminate kerf loss or loss due to squaring. Sheets produced horizontally from a melt also may be less expensive than a silicon ribbon pulled vertically from a melt. Furthermore, sheets produced horizontally from a melt may improve the crystal quality of the sheet compared to silicon ribbons pulled vertically or at an angle from a melt. A crystal growth method such as this that can reduce material costs would be a major enabling step to reduce the cost of silicon solar cells.

Horizontal ribbons of silicon that are physically pulled from a melt have been tested. In one method, a seed attached to a rod is inserted into the melt and the rod and resulting sheet are pulled at a low angle over the edge of the crucible. The angle, surface tension, and melt level are balanced to prevent the melt from spilling over the crucible. It is difficult, however, to initiate and control such a pulling process. First, the angle of inclination adjustment to balance gravity and surface tension of the meniscus formed at the crucible edge may be difficult. Second, a temperature gradient along the ribbon at the separation point between the sheet and the melt may cause dislocations in the crystal if the cooling plate is near this separation point. Third, inclining the sheet above the melt may result in stress at the freeze tip. This freeze tip may be where the sheet is thinnest and most fragile so dislocations or breaks in the sheet may occur. Fourth, a complex pulling apparatus may be needed to obtain the low angle.

The sheet must be removed from the melt surface without spilling the melt. Thus, the meniscus between the underside of the sheet and the melt must remain stable or attached to the vessel. Previously, pressure has been reduced in the melt side of the meniscus to maintain the stability of the meniscus. In one example, the Low Angle Silicon Sheet (LASS) method inclined the sheet at a small angle and pulled up on the melt. This created negative pressure in the melt relative to atmospheric pressure and provided a pressure across the meniscus. In another example, the melt may be flowed over the edge of a spillway. The drop in fluid in the nape of the spillway provides a negative pressure in the melt to stabilize the meniscus. However, there is a need in the art for an improved method of removing a sheet from a melt and, more particularly, removing a sheet from a melt with local pressure.

SUMMARY

According to a first aspect of the invention, a sheet production apparatus is provided. The apparatus comprises a vessel configured to hold a melt of a material. A cooling plate is disposed proximate the melt and is configured to form a sheet of the material that is horizontal on the melt proximate the cooling plate. A first gas jet is configured to direct a gas toward an edge of the vessel.

According to a second aspect of the invention, a method of sheet production is provided. The method comprises translating a sheet of a material horizontally on a surface of a melt of the material. A gas is directed from a first gas jet at a meniscus of the melt and the sheet is removed from the melt.

According to a third aspect of the invention, a method of forming a sheet is provided. The method comprises applying a seed to a melt of a material. A gas is directed from a first gas jet at a meniscus of the melt formed against the seed. A portion of the melt is frozen to form a sheet of the material that is horizontal on a surface of the melt. The sheet is removed from the melt.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, LEDs, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
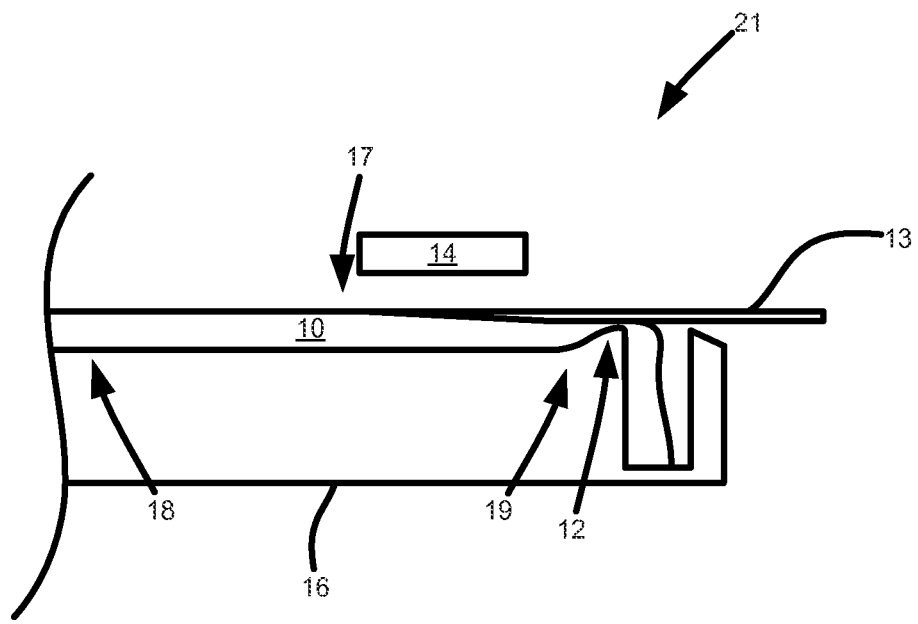
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16. The vessel 16 may be, for example, tungsten, boron nitride, aluminum nitride, molybdenum, graphite, silicon carbide, or quartz. The vessel 16 is configured to contain a melt 10. This melt 10 may be silicon. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. The depth at which the sheet 13 is located is based partly on the relative densities of the sheet 13 and melt 10. In one instance, only 10% of the sheet 13 protrudes from above the top of the melt 10. The melt 10 may circulate within the sheet-forming apparatus 21.

This vessel 16 defines at least one channel 17. This channel 17 is configured to hold the melt 10 and the melt 10 flows from a first point 18 to a second point 19 of the channel 17. The melt 10 may flow due to, for example, a pressure difference, gravity, a pump, or other methods of transport. The melt 10 then flows over the spillway 12. This spillway 12 may be a ramp, a weir, a ledge, a small dam, or a corner and is not limited to the embodiment illustrated in FIG. 1. The spillway 12 may be any shape that allows a sheet 13 to be separated from the melt 10.

In one particular embodiment, the vessel 16 may be maintained at a temperature slightly above approximately 1685 K. For silicon, 1685 K represents the freezing temperature or interface temperature. By maintaining the temperature of the vessel 16 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but also may include multiple segments or sections. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 may be any temperature above the melting temperature of the melt 10. This prevents the melt 10 from solidifying on the vessel 16.

The sheet-forming apparatus 21 may be maintained at a temperature slightly above the freezing temperature of the melt 10 by at least partially or totally enclosing the sheet-forming apparatus 21 within an enclosure. If the enclosure maintains the sheet-forming apparatus 21 at a temperature above the freezing temperature of the melt 10, the need to heat the sheet-forming apparatus 21 may be avoided or reduced and heaters in or around the enclosure may compensate for any heat loss. This enclosure may be isothermal with anisotropic conductivity. In another particular embodiment, the heaters are not disposed on or in the enclosure and are rather in the sheet-forming apparatus 21. In one instance, different regions of the vessel 16 may be heated to different temperatures by embedding heaters within the vessel 16 and using multi-zone temperature control.

The enclosure may control the environment where the sheet-forming apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the formation of the sheet 13.

The cooling plate 14 allows heat extraction that enables the sheet 13 to form on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. Disturbances to the melt 10 may be reduced while the sheet 13 forms to prevent imperfections in the sheet 13. Cooling a sheet 13 on the surface of the melt 10 or a sheet 13 that floats on the melt 10 allows the latent heat of fusion to be removed slowly and over a large area while having a relatively large sheet 13 extraction rate.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a sheet 13 because no external stress is applied to the sheet 13. Of course, the sheet 13 also may be pulled or have some external force applied. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions. The sheet 13 may tend to go straight beyond the spillway 12 in one embodiment. This sheet 13 may be supported after going over the spillway 12 in some instances to prevent breakage.

Figure 2:
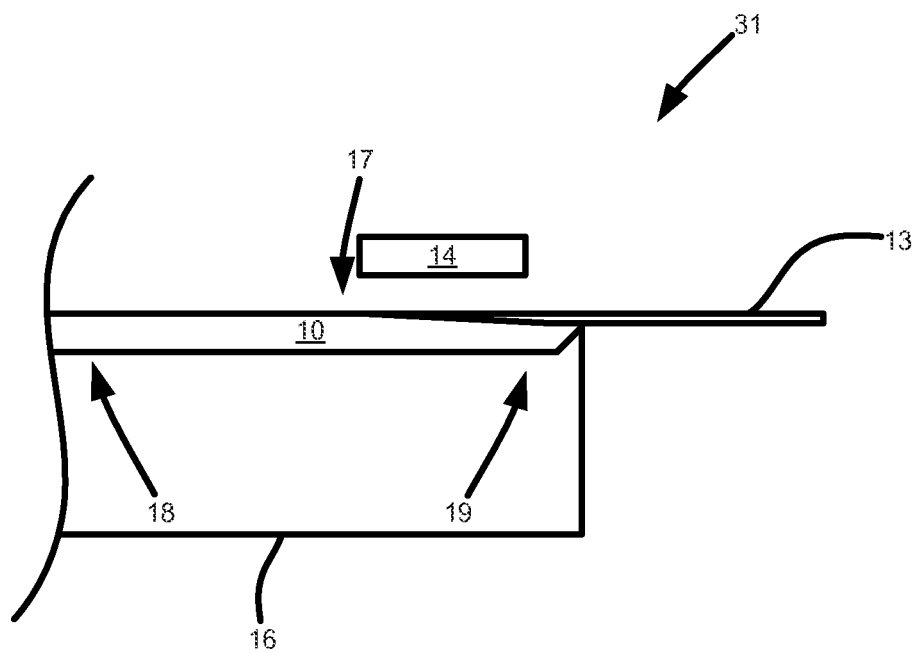
FIG. 2 is a cross-sectional side view of a second embodiment of an apparatus that separates a sheet from a melt.

Of course, different cooling temperatures across the length of the cooling plate 14, different flow rates of the melt 10 or pull speeds of the sheet 13, the length of the various sections of the sheet-forming apparatus 21, or the timing within the sheet-forming apparatus 21 may be used for process control. If the melt 10 is silicon, the sheet 13 may be polycrystalline or single crystal sheet using the sheet-forming apparatus 21. FIG. 1 is only one examples of a sheet-forming apparatus that can form a sheet 13 from a melt 10. Other apparatuses or methods of horizontal sheet 13 growth are possible. The embodiments described herein may be applied to any horizontal sheet 13 growth method or apparatus. Thus, the embodiments described herein are not limited solely to the specific embodiment of FIG. 1. For example, FIG. 2 is a cross-sectional side view of a second embodiment of an apparatus that separates a sheet from a melt. In the sheet-forming apparatus 31, the melt 13 is contained in the vessel 16. A sheet 13 is pulled from the melt 10 after formation by the cooling plate 14. While horizontal in FIG. 2, the sheet 13 also may be at an angle with respect to the melt 10. In the embodiments of FIGS. 1-2, the melt 10 may circulate around the sheet-forming apparatus 21 or sheet-forming apparatus 31, such as around the sides of the sheet-forming apparatus 21 or sheet-forming apparatus 31. Of course, the melt 10 also may be stationary during part or all of the sheet 13 formation process.

A meniscus interface forms when a liquid is in contact with a gas. This interface follows the Young-Laplace Equation. In two dimensions, it takes the form:

$$\Delta P = \frac{\sigma}{R}$$

$$\frac{1}{R(x)} = \frac{\left|\frac{\partial^2 y}{\partial x^2}\right|}{\left(1 + \left(\frac{\partial y}{\partial x}\right)^2\right)^{3/2}}$$

where $\Delta P$ is the difference in pressure across the interface, $\sigma$ is the surface tension of the liquid, and R is the radius of curvature of the surface.

Figure 3:
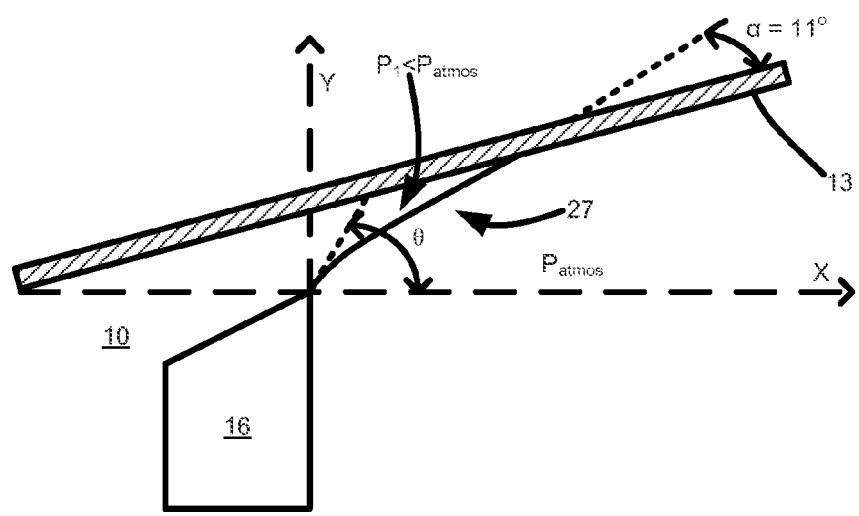
FIG. 3 is a cross-sectional side view of meniscus stabilization for LASS.

FIG. 3 is a cross-sectional side view of meniscus stabilization for LASS. In terms of the coordinate system of FIG. 3, the radius of curvature may be expressed in terms of the first and second derivatives of the line describing the meniscus. The difference in pressure across the meniscus 27 in FIG. 3 is due to the hydrostatic pressure in the liquid of the melt 10 due to gravity ($\rho gy$). Thus, the Young-Laplace Equation becomes a second order differential equation:

$$\frac{\partial^2 y}{\partial x^2} = -\frac{1}{\sigma}(\rho g y(x))\left(1 + \left(\frac{\partial y}{\partial x}\right)^2\right)^{3/2}$$

The concave shape of the meniscus 27 illustrated in FIG. 3 is provided by the negative pressure ($P_1$) relative to the atmospheric pressure ($P_{atmos}$). This is formed by lifting up and angling the sheet 13 with respect to the X-axis to allow the higher elevation of the sheet 13 at the edge of the wall of the vessel 16 while the freezing front of the sheet 13 is lower at the melt 10 height. In FIG. 3, $\alpha$ represents the contact angle between the melt 10 in the meniscus 27 and the sheet 13 and $\theta$ represents the contact angle between the melt 10 in the meniscus 27 and the vessel 16. For a melt 10 composed of silicon and a vessel 16 composed of quartz, $\theta$ is approximately 87°. These angles may vary based on the materials. While the melt 10 level may be at the x axis in FIG. 3, the melt 10 level may be elsewhere relative to the vessel 16.

Gas jets may be used to stabilize the meniscus by increasing local pressure in the melt. For example, local pressure on the gas side of the meniscus may be increased. Meniscus stabilization using the embodiments described herein is independent of any melt flow so that crystal initialization may occur before the melt begins to flow, which simplifies seeding in systems that use melt flow. The sheet may be grown horizontally using the embodiments described herein, which eliminates the complicated balance of growth rate (i.e., heat removal) against pull speed at an angle. Sheet growth may be upstream of the edge of the vessel where separation from the melt occurs.

Figure 4:
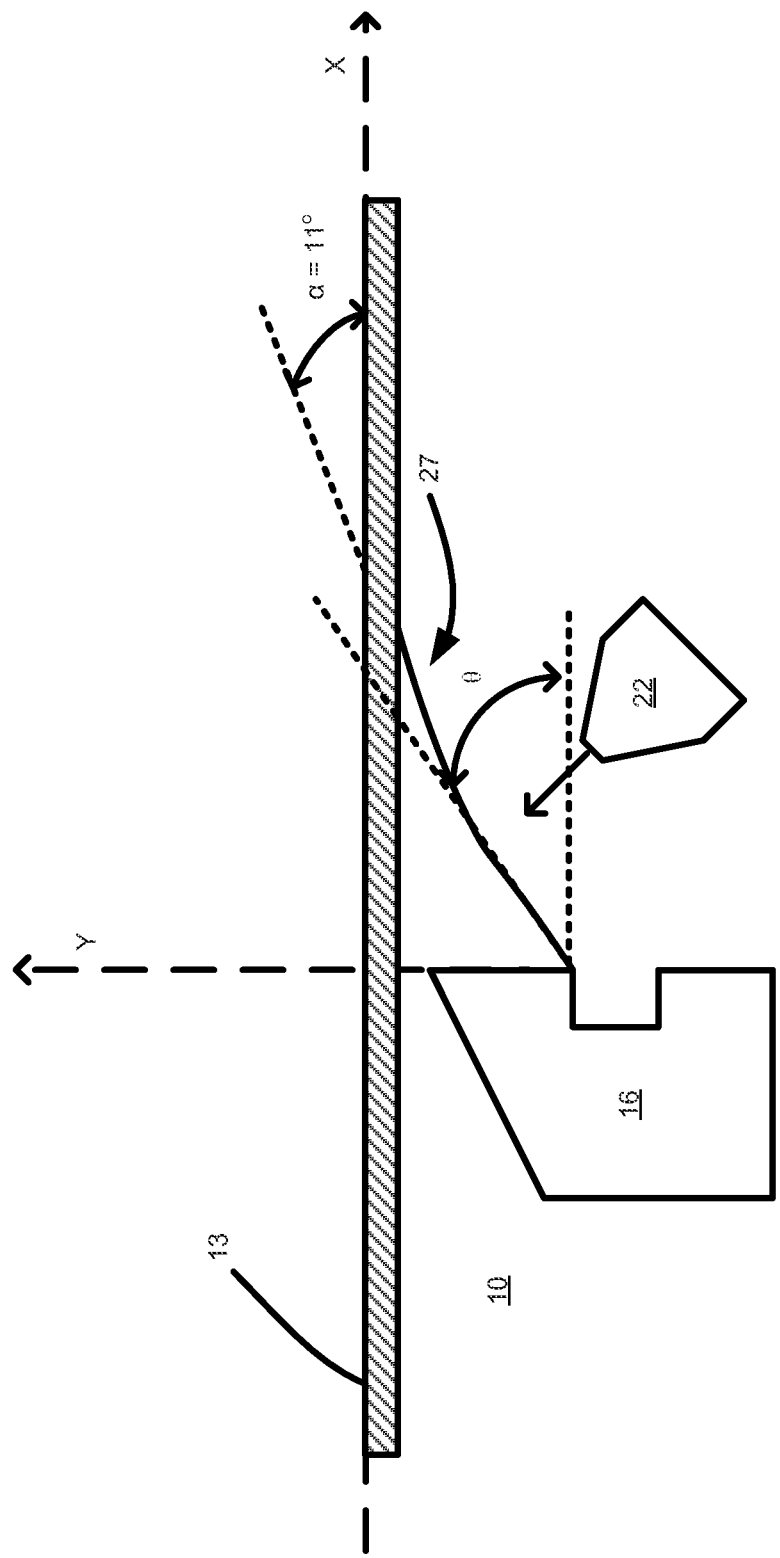
FIG. 4 is a cross-sectional side view of an embodiment of meniscus stabilization using gas impingement.
Figure 6:
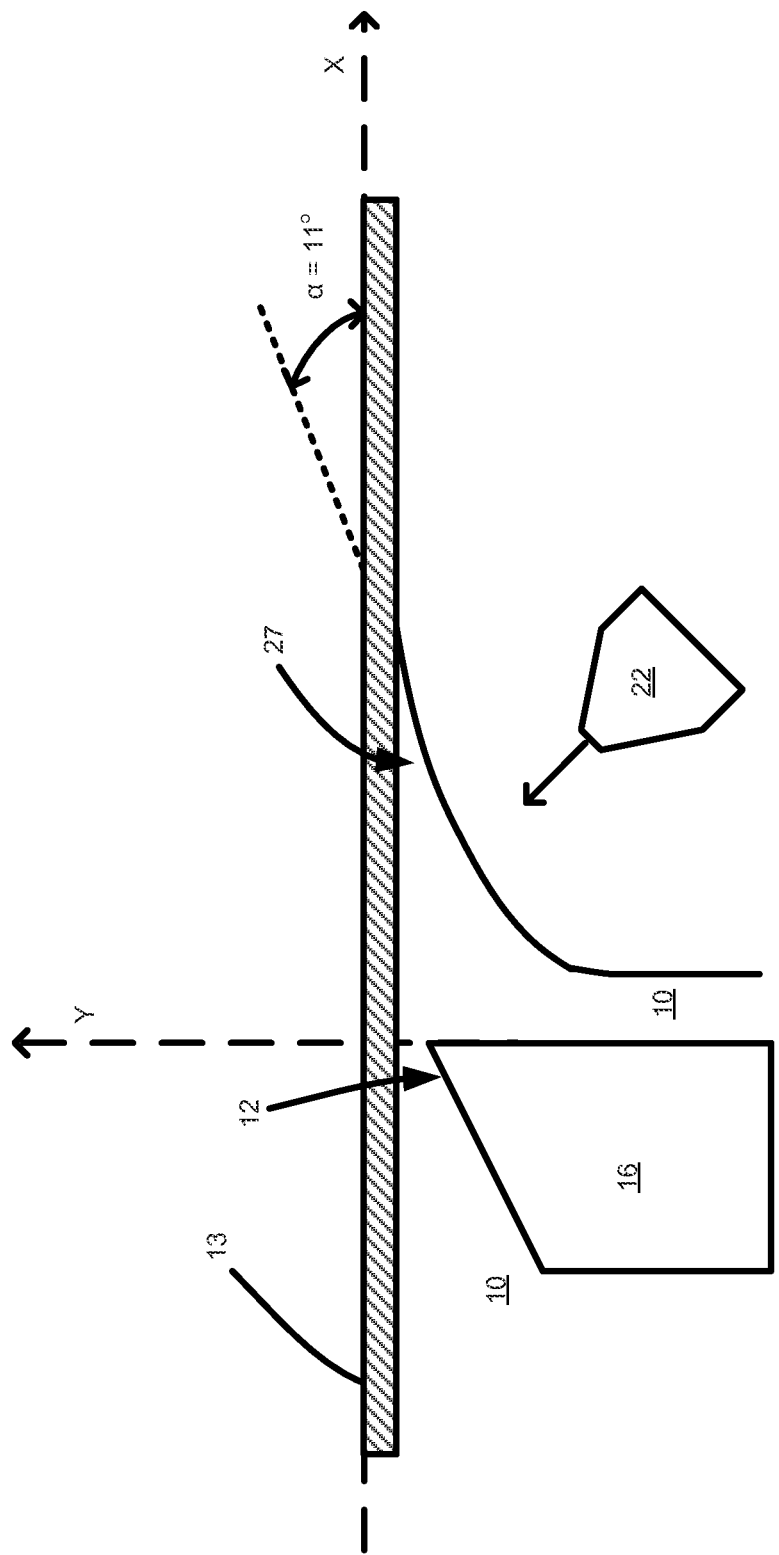
FIG. 6 is a cross-sectional diagram of an embodiment of meniscus stabilization using gas impingement with a spillway.

FIG. 4 is a cross-sectional side view of an embodiment of meniscus stabilization using gas impingement. In this embodiment, the sheet 13 is pulled horizontally. The wall of the vessel 16 is below the level of the surface of the melt 10, which in this instance is at the intersection of the x and y axes or where the sheet 13 is located. The melt 10 is prevented from spilling by the formation of the meniscus 27 under the sheet 13. Of course, while not illustrated, the melt 10 may still circulate over the edge of the vessel 16, such as using the spillway 12 illustrated in FIG. 1, and still form a meniscus 27, as illustrated in FIG. 6. Turning back to FIG. 4, The pressure difference to maintain the concave meniscus 27 is provided by the gas jet 22 under the meniscus 27, which is angled toward the meniscus 27 or edge of the vessel 16 as indicated by the arrow leaving the gas jet 22. In such an instance, the Young-Laplace Equation takes the form:

$$\frac{\partial^2 y}{\partial x^2} = \frac{1}{\sigma}(-\rho g y(x) - P_{jet}(x, y))\left(1 + \left(\frac{\partial y}{\partial x}\right)^2\right)^{3/2}$$

The Young-Laplace Equation in this case is a second order differential equation that requires two boundary conditions. In the embodiments of FIGS. 3-4, the meniscus 27 is pinned to the wall of the vessel 16, so that its location is fixed at x=0. At the other end of the meniscus where it connects with the sheet 13, the meniscus 27 is not pinned and the angle made with the sheet 13 is determined by the surface energy between the solid, liquid, and the gas. For a solid silicon sheet 13 in contact with its melt 10, the contact angle α may be between approximately 0° and 11°. If $y_0$ is specified at x=0, the location of the contact point of the meniscus 27 with the sheet 13 and the initial contact angle are determined by the solution to the differential equations.

The magnitude of the pressure at the exit of the gas jet 22 depends on the flow of gas and the width of the opening in the gas jet 22 that allows the flow of gas. The opening may be, for example, a slit jet. This may be at least partly estimated using conservation of momentum. So at the stagnation point where the gas bounces off the meniscus 27, the pressure would be:

$$P = \frac{1}{2}\rho_g u_g^2 = \frac{1}{2}\rho_g \left(\frac{Q_g}{A}\right)^2$$

where $\rho_g$, $u_g$, and $Q_g$ are the gas density, velocity, and volume flow rate, respectively. The following example calculates the flow of argon needed to obtain a pressure of 40 Pa at the meniscus 27 through an opening in the gas jet 22 that is 0.5 mm in width. The density of the argon at the temperature of the melt 10, which is 1412° C. for silicon, is 0.32 kg/m³.

$$u_g = \left(\frac{2 \cdot 40 \text{ Pa}}{.32 \frac{\text{kg}}{\text{m}^3}}\right)^{1/2} = 15.8 \frac{\text{m}}{\text{s}}$$

$$\frac{Q_g}{L} = u_g \cdot \text{gap} = 15.8 \frac{\text{m}}{\text{s}} \cdot .5 \text{ mm} = \frac{7.9 \frac{1}{\text{s}}}{\text{m}}$$

for 20 cm wide ribbon $Q_g = 95$ lpm

The pressure estimated here may only exist at the exit of the gas jet 22.

$$P_{jet}(x, y) = P_0 e^{-(a(x-x_0)^2 + 2b(y-y_0)^2(x-x_0)^2 + c(y-y_0)^2)}$$

$$a = \frac{\cos^2\theta}{2\sigma_x^2} + \frac{\sin^2\theta}{2\sigma_y^2}$$

$$b = -\frac{\sin 2\theta}{4\sigma_x^2} + \frac{\sin 2\theta}{4\sigma_y^2}$$

$$c = \frac{\sin^2\theta}{2\sigma_x^2} + \frac{\cos^2\theta}{2\sigma_y^2}$$

The pressure may fall off axially and transversely. The pressure distribution may be approximated as an elliptical Gaussian.

Figure 5:
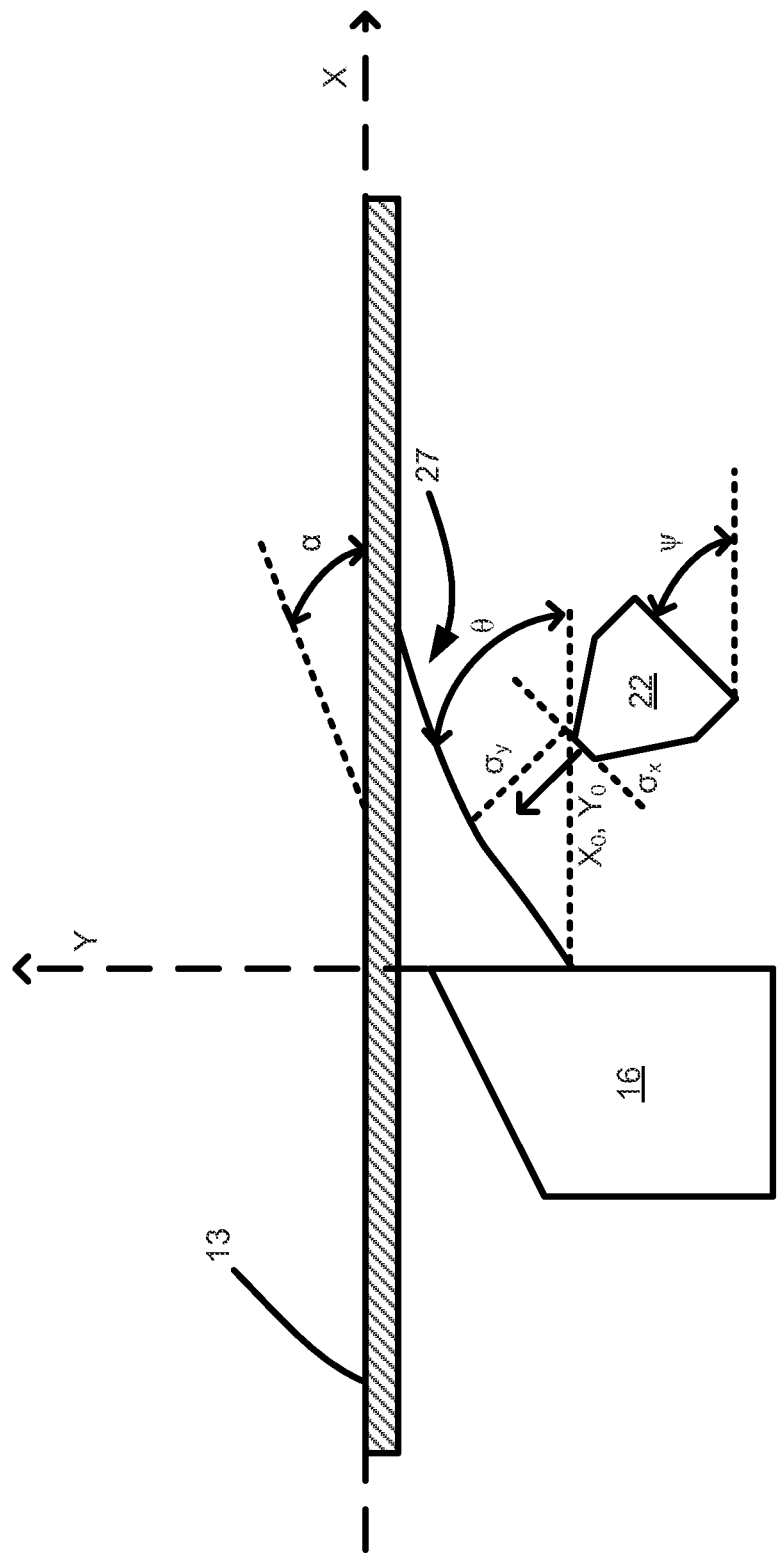
FIG. 5 is a cross-sectional diagram illustrating pressure distribution from a gas jet.

FIG. 5 is a cross-sectional diagram illustrating pressure distribution from a gas jet. This solves the equations above. In all cases, $P_0$=40 Pa, $x_0$=6 mm at the exit of the gas jet 22, $y_0$=−4 mm at the exit of the gas jet 22, $\sigma_x$=4 mm, $\sigma_y$=0.8 mm, and ψ=45°. $\sigma_x$ and $\sigma_y$ represent the elliptical distribution of pressure around the gas jet 22. Where the meniscus 27 is pinned to the vessel 16 affects the shape of the meniscus 27. When α=11°, the meniscus 27 is pinned to the wall of the vessel 16 at 1 mm below the sheet 13 and θ=17°. When α=11°, the meniscus 27 is pinned to the wall of the vessel 16 at 2 mm below the sheet 13 and θ=15.87°. When α=11°, the meniscus 27 is pinned to the wall of the vessel 16 at 2.5 mm below the sheet 13 and θ=10.58°. When α=0°, the meniscus 27 is pinned to the wall of the vessel 16 at 1 mm below the sheet 13 and θ=7.21°.

Thus, by using gas impingement, a stable meniscus 27 can be pinned to the wall of the vessel 16 at least 2.5 mm below the sheet 13 with a contact angle of approximately 11°. Even if the contact angle were as low as 0°, a stable meniscus 27 could still be maintained 1 mm below the wall of the vessel 16. The gas jet impingement also may compensate for any drag caused by viscous forces. The pressure of the gas jet impingement can be configured to stabilize the meniscus 27 or assist in maintaining the pinning of the meniscus 27 to the vessel 16.

FIG. 6 is a cross-sectional diagram of an embodiment of meniscus stabilization using gas impingement with a spillway. The melt 10 flows over the spillway 12. A meniscus 27 forms with the melt 10 passing over the spillway 12. Of course, other embodiments are possible.

Figure 7:
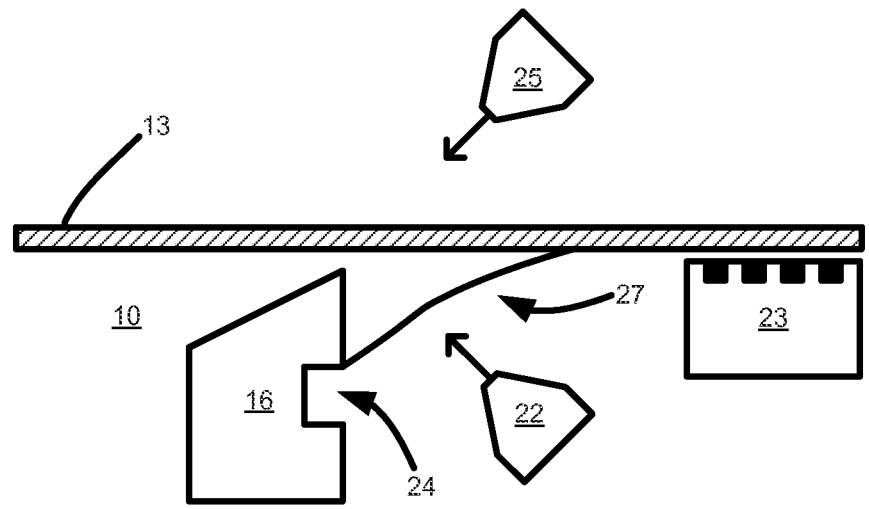
FIG. 7 is a cross-sectional side view of a first embodiment of a gas jet with sheet formation.

FIG. 7 is a cross-sectional side view of a first embodiment of a gas jet with sheet formation. This system has a gas jet 22 separate from the support table 23. The support table 23 may use jets of air or some other fluid to support the sheet 13, but also could use rollers or some other mechanism. In this particular embodiment, two gas jets 22, 25 are used, though greater or fewer may be provided. The gas jet 22 under the sheet 13 stabilizes the meniscus 27 and may adjust position and angle. The gas jet 25 above the sheet 13 balances any vertical component of impingement forces from the gas jet 22. The flow from the gas jet 22 and gas jet 25 may be approximately equal in one instance, though other flows are possible. Argon, another noble gas, another inert gas, or other species known to those skilled in the art may be used with the gas jet 22 or gas jet 25. The vessel 16 may contain a feature or groove 24 that pins the meniscus 27 of the melt 10 and allows a large variation in contact angle without drips. While a surface of the vessel 16 without the feature or groove 24 can have a meniscus 27 pinned to it, the angle of the meniscus 27 before drips occur is limited. For example, this angle may be approximately 87°. Adding the feature or groove 24 enable the meniscus 27 to sag or have an angle of approximately 177° from the surface of the vessel 16 before drips occur.

Figure 8:
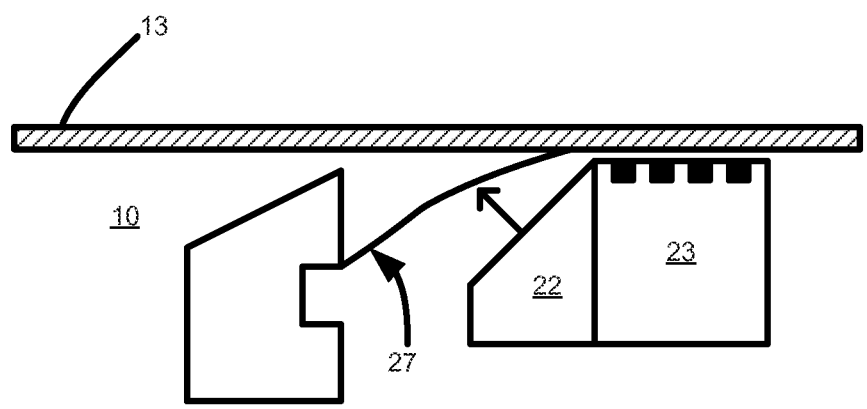
FIG. 8 is a cross-sectional side view of a second embodiment of a gas jet with sheet formation.

FIG. 8 is a cross-sectional side view of a second embodiment of a gas jet with sheet formation. In this embodiment, the gas jet 22 is incorporated into the support table 23. In an alternate embodiment, a gas jet above the sheet 13 may be provided to balance vertical impingement forces as illustrated in FIG. 7.

Figure 9:
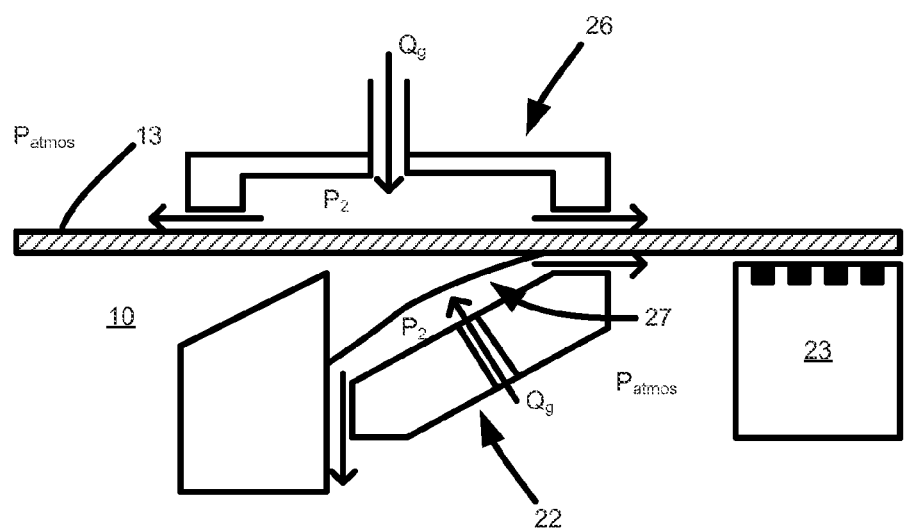
FIG. 9 is a cross-sectional side view of a third embodiment of a gas jet with sheet formation.

FIG. 9 is a cross-sectional side view of a third embodiment of a gas jet with sheet formation. The gas jet 22 is part of a pressure cell 26. There is higher pressure ($P_2$) within the pressure cell 26 due to the limited conduction at the edges or seals. The gas in the pressure cell 26 flows as indicated by the arrows. $P_2$ in this instance is greater than atmospheric pressure ($P_{atmos}$). The top section of the pressure cell 16 floats on gas bearings over the bottom section. The level of the bottom section may be configured to be matched to the level of the melt 10. The gaps or seals between the pressure cell 26 and the sheet 13 may be less than 0.5 mm in dimension in one instance. The meniscus 27 is contained within this pressure cell 26 at least partly because of the gas jet 22 that is part of the bottom section of the pressure cell 26.

Figure 10:
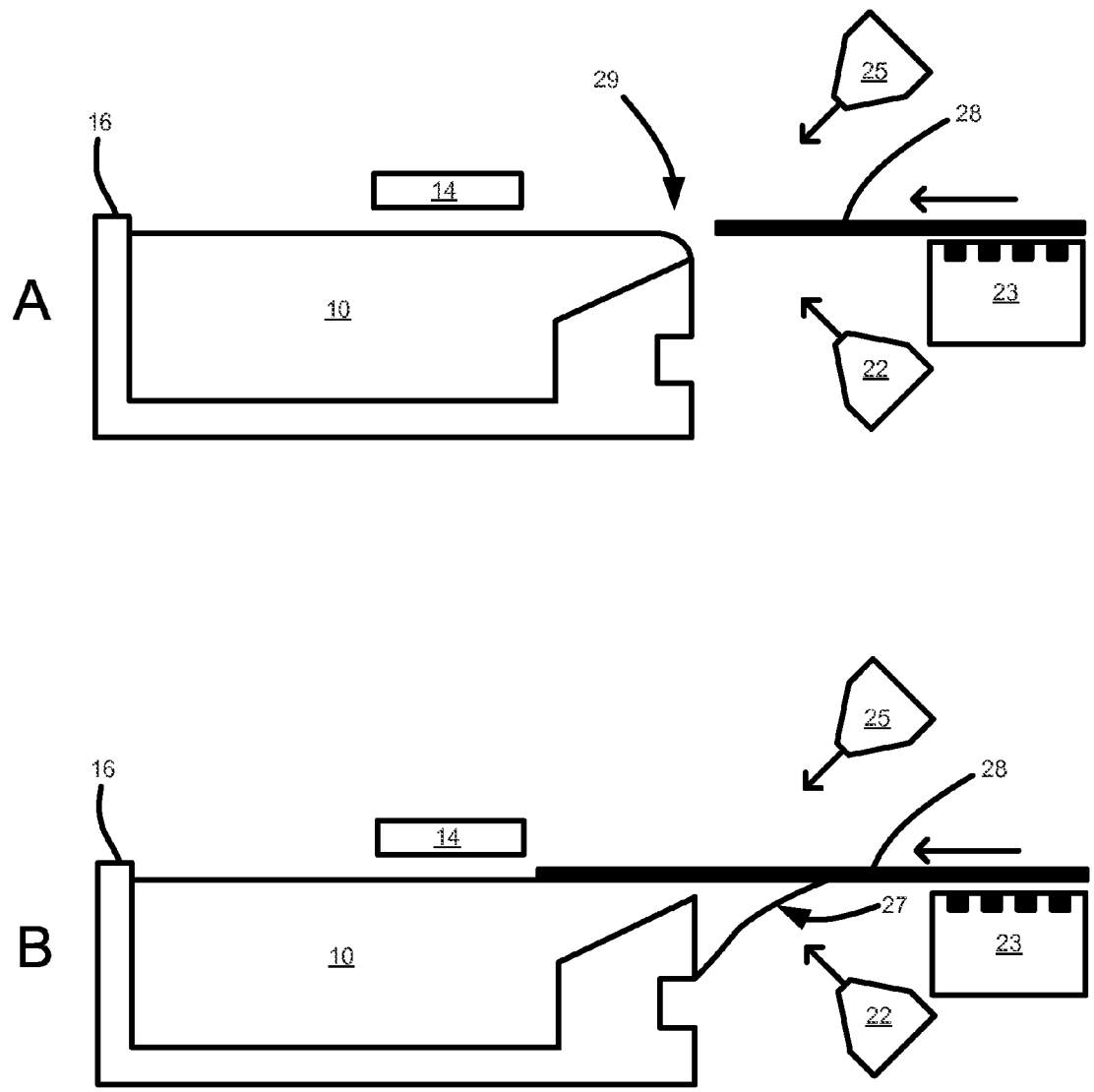
FIGS. 10A-D illustrate seeding enabled by gas jet stabilization.
Figure 10:
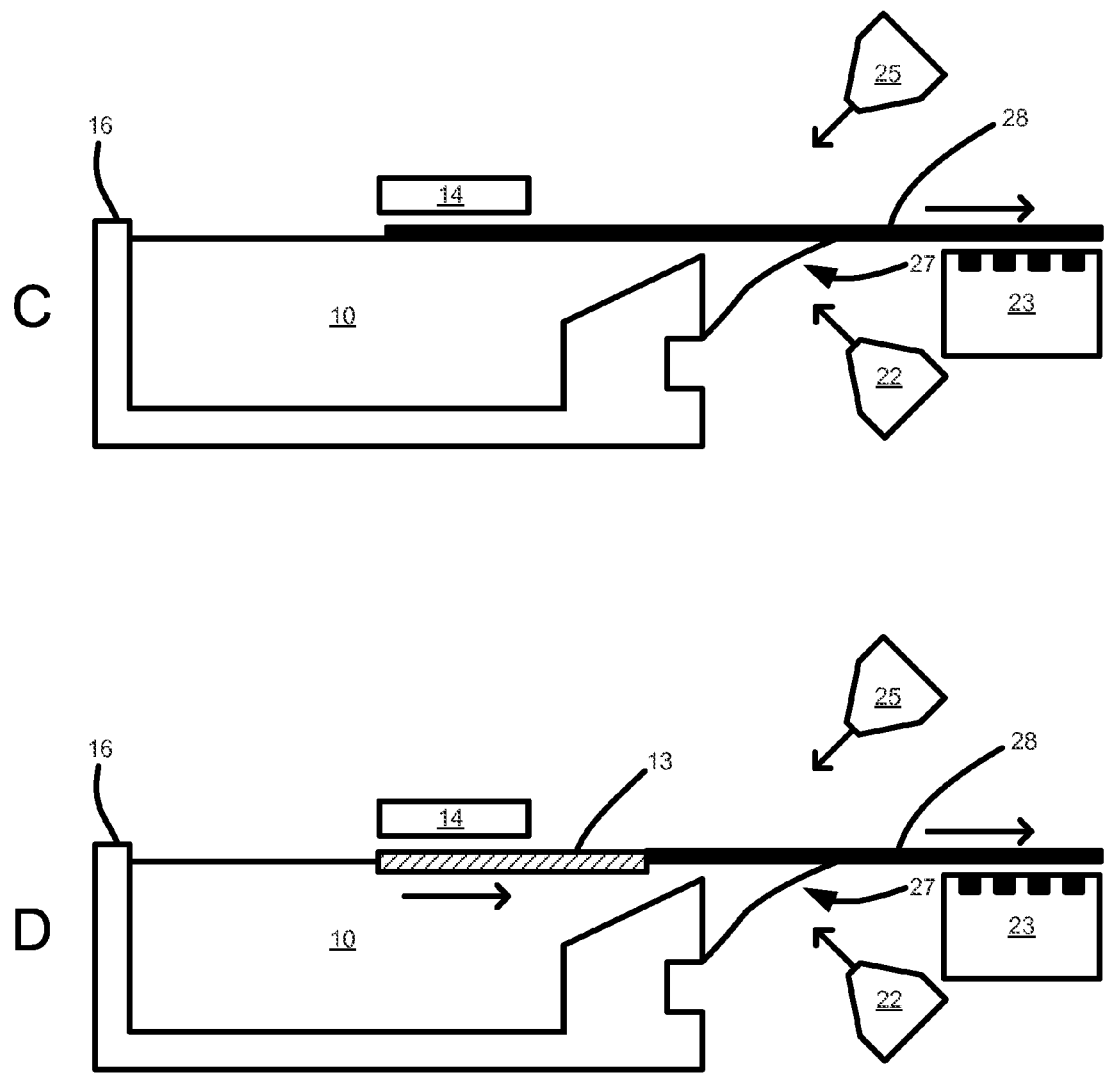

FIGS. 10A-D illustrate seeding enabled by gas jet stabilization. Embodiments disclosed herein stabilize the meniscus independent of flow within the vessel 16. Thus, crystal initiation may begin before the melt 10 begins to flow and simplifies the sheet fabrication process. In FIG. 10A, a seed wafer 28 is inserted. The seed wafer 28 may be, for example, an electronics-grade silicon wafer approximately 0.7 mm thick with the desired crystal orientation. The level of the seed wafer 28 is controlled by having it ride above a support table 23 that controls the level of the seed wafer 28 against the level of the melt 10. The melt 10 may form a mesa 29 or be above the edge of the wall of the vessel 16 using the surface tension of, for example, the silicon in the melt 10. Thus, before the seed wafer 28 touches the melt 10, a convex meniscus is formed in the melt 10, as illustrated in FIG. 10A. The gas jets 22, 25 may be used to stabilize this meniscus before the seed wafer 28 touches the melt 10. Of course, more or fewer gas jets are possible.

In FIG. 10B, the seed wafer 28 touches the melt 10 after moving in the direction of the arrow. A meniscus 27 forms beneath the seed wafer 28. This meniscus 27, which may be concave, bridges the gap between the wall of the vessel 16 and the seed wafer 28. Beyond the width of the seed wafer 28, the convex meniscus 27 remains attached to the wall of the vessel 16. There may be a non-uniform meniscus at this transition between the mesa 29 meniscus and the concave meniscus 27 beneath the seed wafer 28. This non-uniformity likely will not affect the thickness uniformity or quality of the sheet 13 because the process occurs in a nearly isothermal environment.

The seed wafer 28 is translated in FIG. 10C in the direction of the arrow. This translation may be caused by a roller or some other mechanism at an end of the seed wafer 28. The seed wafer 28 moves under the cooling plate 14 opposite the direction that the seed wafer 28 was inserted. The cooling plate 14 may be turned off initially or be at a temperature at or above the temperature of the melt 10. If the cooling plate 14 is located a certain distance upstream of the wall of the vessel 16 where the meniscus 27 is attached, effects of the meniscus 27 may be minimized. As the cooling plate 14 is turned on, freezing is initiated near the seed wafer 28. The seed wafer 28 pulling motion begins and a sheet 13 is pulled out.

In FIG. 10D, the melt 10 begins flowing using, for example, a pump. The melt 10 may go over a spillway in an alternate embodiment. The width of the sheet 13 may be increased as the melt 10 begins to flow. The temperature of the cooling plate 14 and speed of the melt 10 flow or sheet 13 movement may be adjusted to achieve the desired thickness in the sheet 13. Thus, a steady-state process may be achieved.

Meniscus stabilization using gas jets has multiple advantages. It may be applied to a horizontal sheet formation or horizontal ribbon growth (HRG) system and may be used to avoid LASS in one instance. The sheet 13 may be pulled horizontally in one embodiment, thereby allowing the crystal forming region to be upstream of the meniscus 27. This minimizes perturbations caused by a pulling mechanism from affecting the sheet 13 while it forms. The melt 10 flow speed may be controlled independently of the speed of the sheet 13. This may enable a simpler seeding process. Furthermore, spills of the melt 10 may be reduced or prevented.

Figure 11:
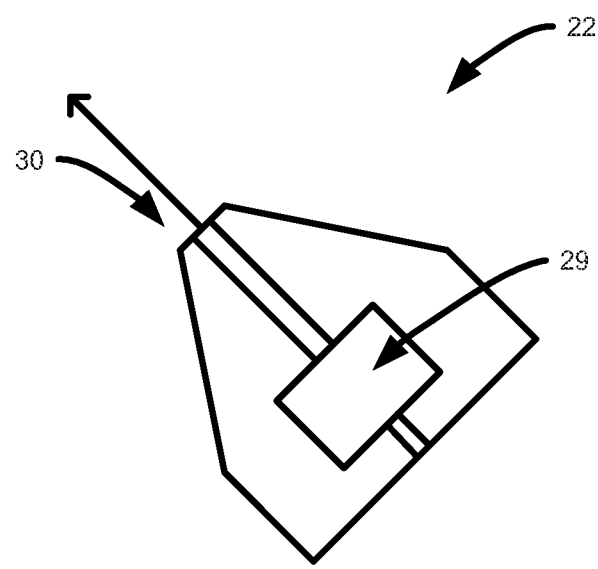
FIG. 11 is a cross-sectional view of an embodiment of a gas jet.

FIG. 11 is a cross-sectional view of an embodiment of a gas jet. The gas jet 22 has a plenum 29 and opening 30. Gas flows in the direction of the arrow. Having a larger plenum 29 than an opening 30 may ensure uniform pressure and flow across the dimensions of the opening 30. In one embodiment the opening 30 has a width approximately equal to the width of the sheet, such as the sheet 13 in FIG. 4. Of course, other dimensions are possible.

In the embodiments disclosed herein, the gas jet 22 may direct gas at a particular temperature. The gas may be heated to prevent the meniscus from freezing. The gas also may be cooled to prevent the sheet from being melted or to otherwise cool the sheet.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A sheet production apparatus comprising:
a vessel configured to hold a melt of a material;
a cooling plate disposed proximate said melt, said cooling plate configured to form a sheet of said material that is horizontal on said melt proximate said cooling plate;
a first gas jet configured to direct a gas toward a meniscus at a juncture of a bottom surface of the sheet and an edge of said vessel; and
a pressure cell that is separate from and downstream of the cooling plate in a direction in which the melt flows, the pressure cell defined by a top section including a ceiling and adjoining sidewalls disposed above the sheet over the first gas jet and defining a gap of less than 0.5 millimeters between a lower extent of the sidewalls and the sheet, the pressure cell further defined by a bottom section including a floor disposed below the sheet and integral with the first gas jet, wherein the pressure cell encloses a gas at a higher pressure than a surrounding atmosphere and wherein the gas is allowed to escape the pressure cell through the gap.

2. The apparatus of claim 1, further comprising a pump associated with the vessel and oriented to circulate said melt within said vessel.

3. The apparatus of claim 1, further comprising a second gas jet configured to direct said gas toward said edge of said vessel, said second gas jet positioned opposite said first gas jet and integral with the top section.

4. The apparatus of claim 1, further comprising a support table disposed adjacent said first gas jet, said support table configured to support said sheet.

5. The apparatus of claim 1, wherein said material is silicon or silicon and germanium.

* * * * *